United States Patent [19]
Franchi et al.

[11] Patent Number: 5,204,685
[45] Date of Patent: Apr. 20, 1993

[54] ARC RANGE TEST FACILITY

[75] Inventors: Peter R. Franchi, Winchester; Harvey E. Tobin, Brookline, both of Mass.

[73] Assignee: The United States of America as represented by the Secretary of the Air Force, Washington, D.C.

[21] Appl. No.: 907,251

[22] Filed: Jul. 1, 1992

[51] Int. Cl.$^5$ .............................................. H01Q 3/00
[52] U.S. Cl. ..................................................... 342/360
[58] Field of Search .................. 342/360, 351; 343/703

[56] References Cited

U.S. PATENT DOCUMENTS

| | | | |
|---|---|---|---|
| 3,879,733 | 4/1973 | Hansen et al. | 343/100 AP |
| 4,218,683 | 8/1980 | Hemming | 343/703 |
| 4,553,145 | 11/1985 | Evans | 343/360 |
| 4,661,820 | 4/1987 | Pouit et al. | 342/351 |
| 4,998,112 | 5/1991 | Franchi et al. | 342/360 |

Primary Examiner—Theodore M. Blum
Attorney, Agent, or Firm—William G. Auton; Donald J. Singer

[57] ABSTRACT

In order to measure the far field antenna pattern of a phased array antenna, the phased array is focused at a probe antenna which is a specific distance away from the aperture. The antenna pattern is then measured by moving the probe antenna on a constant focal arc. This arc minimizes phase aberrations due to defocusing error. To minimize amplitude errors, the pattern of the probe antenna is carefully matched to compensate for the variation induced amplitude error.

8 Claims, 6 Drawing Sheets

ARC RANGE TEST FACILITY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to radar antennas, and more specifically the invention pertains to a process for measuring the antenna pattern of a phased array antenna.

Traditional antenna measurements use $2D^2/\lambda$ as a criteria for measuring an antenna under test (AUT) in the far field, where R is the distance from the AUT to a point in space, D is the aperture size of the AUT, and $\lambda$ is the operating wavelength. Problems arise when D becomes large, which increases the distance R, therefore more real estate is needed to measure the far field antenna pattern.

Development over the years has led to techniques to measure the far field pattern of the AUT on smaller ranges. Using a small range reduces outside interference, eliminates testing time due to poor weather conditions, and provides the option of doing classified testing. Many of the previous smaller range techniques eliminate or lessen these problems. There are however, other problems with these techniques. For example, transformation from near field probing to the far field requires many sample points, the large size and high surface tolerance requirements of a reflector restricts the use of a compact range.

There remains a need for a technique to measure the far field antenna pattern over a 100° angular sector that is 1/10 the size of the conventional far field range, but with errors comparable to the errors one would expect from a far field range.

The task of reducing the range requirements while measuring the far field antenna patterns of large antenna arrays is alleviated, to some extent, by the systems disclosed in the following U.S. Pat. Nos., the disclosures of which are incorporated herein by reference:

U.S. Pat. No. 4,998,112 issued to Franchi et al;
U.S. Pat. No. 4,661,820 issued to Pouit et al;
U.S. Pat. No. 4,553,145 issued to Evans; and
U.S. Pat. No. 3,879,733 issued to Hansen et al.

The patents identified above, relate to methods for measuring antenna patterns. In particular, the Franchi et al. patent describes a method for measuring the far field antenna pattern of a large phased array antenna by applying a correction factor to the antenna phase shifters. The antenna is electronically steered to each of its scan angles, and a particular correction factor is applied to each radiating element to correct the far field antenna pattern to the shortened far field range.

The Pouit et al. patent is directed to a method and apparatus for determining the radiation pattern of an antenna from measurements in the near-field. The antenna is illuminated by a transmit antenna having wavefronts in the shape of circular cylinders. The radiation pattern of the antenna is expressed by an integral transform of a unidimensional function which is mathematically solved.

The Evans patent relates to a method of forming the far field beam pattern of an antenna at short ranges. The antenna beam pattern is rotated through a rotational angle about the line of sight of a source of radar signaling located at a near-field range away from the antenna. Measurements of the antenna field are taken at predetermined angular increments. The far-field beam pattern of the antenna is formed by deriving discrete values thereof for corresponding angle increments along the angular rotation. The discrete beam pattern value corresponding to each selected angular increment is derived as the weighted summation of the multiplicity of antenna field measurements associated therewith.

The Hansen et al. patent describes an apparatus and method for obtaining far-field antenna patterns. Actual phase and amplitude measurements are obtained in the near-field, and then processed in a digital computer. Theoretical Z-matrix numerical techniques are used to calculate the far-field patterns by solving the matrix for the current distribution on the structure.

While the above-cited references are instructive, the need remains to measure the far field patterns of phased array antennas in a manner that reduces the range requirements. The present invention is intended to satisfy that need.

SUMMARY OF THE INVENTION

The present invention includes a process for measuring a phased array's far field antenna pattern which is exhibited by a beam emitted by the antenna. In one embodiment of the invention this process is accomplished in four steps and can greatly reduce the range requirements at which a probe antenna must be placed in order to measure far field phenomena.

When a radar beam is emitted by an antenna, it exhibits different phenomena at near field and far field locations. At far field locations, the main beam of the antenna pattern is clearly distinguishable from sidelobe phenomena. At near field locations, the antenna pattern is merely a blob of electromagnetic energy in which the main beam is not so easily distinguished from the sidelobes. In order to measure far field antenna patterns, a probe antenna must be placed perhaps several kilometers from the antenna face. This is inconvenient for testing an antenna under laboratory conditions.

In the present invention, the first step of the process includes focusing the beam onto a probe antenna which measures the beam, the probe antenna being positioned at a distance R, where R is a distanced given by $$\frac{R}{\lambda} = \left(\frac{D}{\lambda}\right)^{3/2}$$

where:
    D is a measure of the phased array antenna's aperture and $\lambda$ is a measure of operational wavelength of the beam.

The second step of the process entails measuring the beam with the probe antenna.

The third step of the process entails moving the probe antenna to different positions that are on a focal arc of the phased array antenna.

The fourth step of the process entails repeating the focusing, measuring and moving steps.

In the present invention, the moving step is accomplished by repositioning the probe antenna along different positions along a curve given by $R \cos \theta$ where $\theta$ is an angle from broadside to the probe antenna, and is the focal arc of the phased array antenna. As discussed below, when the probe is positioned along the focal arc at the distances given by the equation above, far field phenomena can be measured with a reduction ratio of between 15 and 90 of the distances normally used.

It is an object of the present invention to allow the testing of antenna pattern far field phenomena at up to nearly 1/10 of the distances normally used.

It is another object of the present invention to minimize phase aberrations due to a defocusing error.

These together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a process for measuring the far field antenna pattern of a phased array antenna. The phased array is focused at a probe antenna which is a specific distance away from the aperture. The antenna pattern is then measured by moving the probe antenna on a constant focal arc. This arc minimizes phase aberrations due to defocusing error. To minimize amplitude errors, the pattern of the probe antenna is carefully matched to compensate for the variation induced amplitude error.

The accepted standard for an antenna to be measured in the far field is given by $2D^2/\lambda$ where $\lambda$ is the operating wavelength and D is the aperture size of the antenna. This criteria is an approximation, and there exists an inherent phase error of $\lambda/16$. This phase error is accepted since having no error would require the antenna being tested to be infinitely removed from the probe antenna.

In the expansion of the distance R given by $$R = R - x\cos(\theta) + \frac{x^2\sin(\theta)}{2R_0} + \frac{x^3\sin^2(\theta)\cos(\theta)}{2R_0^2} + \ldots \quad (1)$$

when the quadratic term $$\frac{x^2\sin(\theta)}{2R_0}$$

has an error of $\lambda/16$, then the error due to the cubic, fourth, and higher order terms are reduced by factors proportional to , etc. If the quadratic term could be set to zero, the minimum range would not be set allowing the much smaller cubic term to grow to $\lambda/16$, and this would occur at a much smaller range. The effects of other type of errors such as amplitude error, fourth order error, elevation plane error, etc., must be monitored to insure these errors do not exceed the cubic error term.

Figure 1:
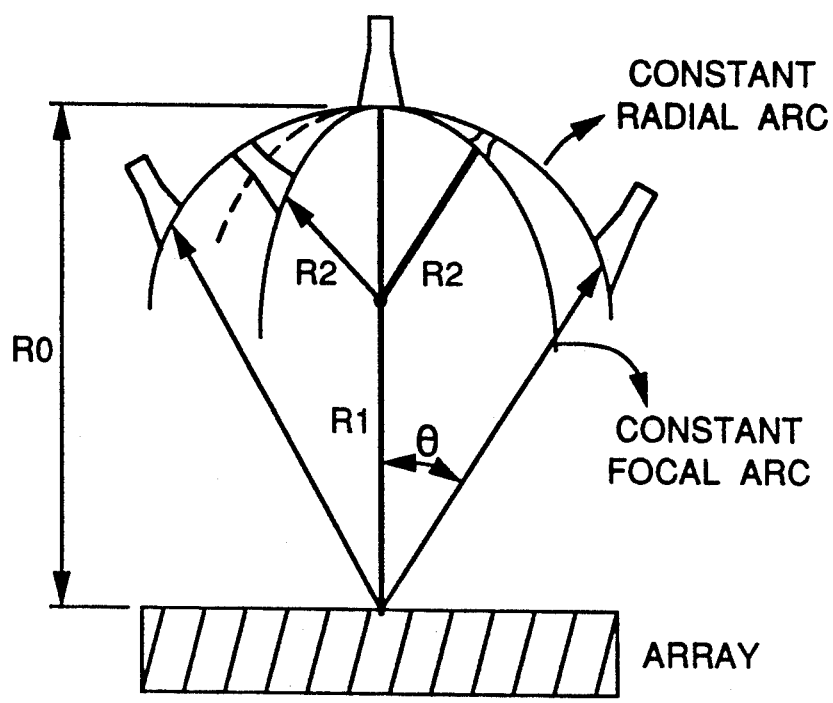
FIG. 1 is an illustration of the arc range test facility geometry of the present invention.

The method of eliminating the quadratic term involves focusing the AUT at some distance R, which is much less than the far field distance. An antenna pattern measured by scanning the array will be a duplicate of the far field pattern for only a small range of angles. To scan beyond this arbitrary angle the array must be repeatedly refocused, if the probe antenna remains a constant distance from the AUT. Reducing this distance as the test probe rotates yields no quadratic error. This basic point is the fundamental condition for this technique. This point can be more easily understood from the derivation of the phase from the test array to the probe antenna. The configuration is shown in FIG. 1, where D is the length of the AUT, $\theta$ is the angle from broadside to the probe antenna, and $R_o$ the distance from the center of the array to the probe.

A general expression describing the field at the probe horn due to the array is given by, $$E(\theta) = C\int f(x)G(x,\theta) e^{\frac{jkr(x,\theta)}{r(x,\theta)}} dx \quad (2)$$

where C is a constant, f(x) is the aperture distribution, G(x, $\theta$) is the pattern of the probe antenna as a function of $\theta$ and r(x, $\theta$) the distance from an arbitrary point on the test array to the probe antenna. Writing r(x, $\theta$) in the usual series expansion form given by $$\begin{aligned} r(x,\theta) &= (r_0^2 + x^2 + 2xr_0\sin(\theta))^{\frac{1}{2}} \\ &= r_0 + \frac{(x^2 + 2xr_0\sin(\theta))r_0}{2r_0^2} - \\ &\quad \frac{(x^2 + 2xr_0\sin(\theta))^2 r_0}{8r_0^4} - \\ &\quad \frac{(x^2 + 2xr_0\sin(\theta))^3 r_0}{16r_0^6} + \ldots \end{aligned} \quad (3)$$

combining terms, $$r(x,\theta) = r_0 + x\sin(\theta) + \frac{x^2(1 - \sin^2(\theta))}{2r_0} - \quad (4)$$

$$\frac{x^3(\sin(\theta) - \sin^3(\theta))}{2r_0^2} + \ldots$$

If $r_o$ is large enough compared to D the quadratic, cubic and higher order terms can be ignored (maximum edge error is $\lambda/16$ when D=X 2). So for the phase only the first two terms apply and the constant term $R_o$ has no effect. If also in equation (2) G(x, $\theta$) is always aimed at the center of the array then (2) can be written as, $$E(\theta) = CG(x,\theta) \int_{-\frac{D}{2}}^{\frac{D}{2}} e^{\frac{jkr(x,\theta)}{r_0}} dx \quad (5)$$

This is the conventional far field expression and is a Fourier transform of the aperture distribution f(x). If quadratic focusing at $R_o$ is added to equation (2) the result is $$E(\theta) = C \int_{-\frac{D}{2}}^{\frac{D}{2}} f(x)G(x,\theta) e^{j\left(\frac{-x^2}{2R_0} + R(x,\theta)\right)} dx \quad (6)$$

Ignoring the terms higher than the cubic, the phase expression will now be $$k\left(r(x,\theta) - \frac{x^2}{2R_0}\right) = \quad (7)$$

$$k(R_0 + x\sin(\theta) + \frac{x^2\cos^2(\theta)}{2R_0} - \frac{x^2}{2R_0} - \frac{x^3\sin(\theta)\cos^2(\theta)}{2R_0^2}$$

The quadratic term is, $$\frac{x^2}{2}\left(\frac{\cos^2(\theta)}{r_0} - \frac{1}{R_0}\right) \quad (8)$$

If $r_o = R_o \cos(\theta)$, the quadratic term is zero, and the cubic term becomes the dominant error source. Since it is smaller than the quadratic term by D $2R_o$, the range requirement can be reduced close to this ratio.

A comparison of the ranges indicates the potential for considerable reduction in range requirement. For the conventional far field $$\frac{R}{\lambda} = 2\left(\frac{D}{\lambda}\right)^2$$

and for this $$\frac{R}{\lambda} = \left(\frac{D}{\lambda}\right)^{\frac{3}{2}}.$$

TABLE 1

| D/λ | R/λ | R/λ (reduced) | Reduction Ratio |
|---|---|---|---|
| 20 | 800 | 89 | 90 |
| 40 | 3200 | 253 | 12.6 |
| 60 | 7200 | 465 | 15.5 |

The significant range reduction indicated by Table 1 cannot be realized unless the amplitude variation in the denominator of equation (1) is compensated by the horn pattern G(x, θ) so that the ratio is constant.

The constant focus arc, defined by $R_o \cos^2(\theta)$ not on a circle as it would be for $R_o \cos(\theta)$. Since it is very convenient to measure antenna patterns by either rotating the transmit antenna or the receive antenna, we choose to approximate the constant focus arc by a circular arc that will be a good match over a large angular range, about 100°. This practical convenience adds some small additional error, which is analyzed in the following.

Figure 2:
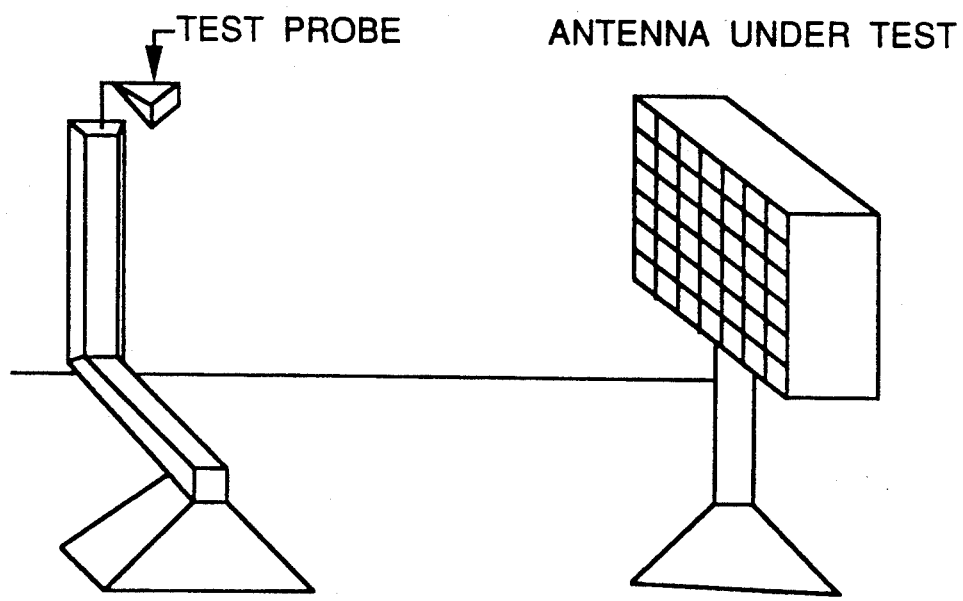
FIG. 2 is an illustration of the elements of an arc range test facility.

FIG. 2, is a schematic drawing of the measurement arrangement. The transmit antenna shown here is a horn mounted away from and above the rotating mount. Absorber covers the vertical and horizontal supports to minimize any reflections from them.

Figure 3:
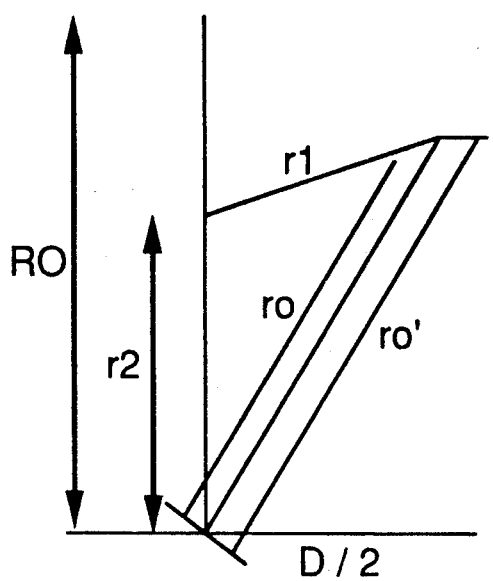
FIG. 3 is a chart of the geometry for range error.

In FIG. 3, $r_1$ is the distance from the antenna being measured to the center of rotation of the mount, $r_2$ is the distance from the transmit antenna (phase center) to the mount, and $r'_o$ the distance from that phase center to the center of the antenna being tested.

Only the changes in path length to various points on the test array caused by using a circular arc instead of the actual constant focus arc will affect the antenna pattern, not the total array phase which will change as a function of θ. The maximum error will occur at the array edges.

Figure 4:
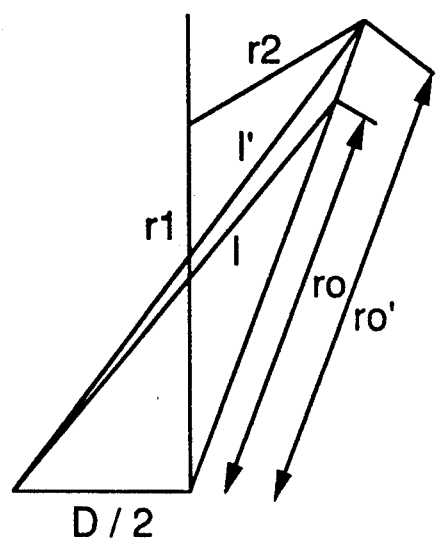
FIG. 4 is a chart of edge phase geometry.
Figure 5:
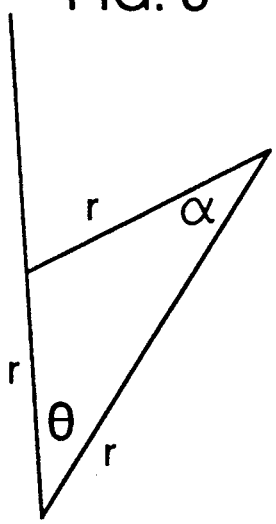
FIG. 5 is a chart for the geometry for amplitude compensation.

In FIG. 4, s is the distance from a point on the constant focus arc to one edge of the test antenna and s' the corresponding point (same angle) on the circular arc to the same edge. From the law of cosines, $$s^2 = \left(\frac{D}{2}\right)^2 + r_0 + Dr_0\sin(\theta) \quad (9)$$

and, $$s'^2 = \left(\frac{D}{2}\right)^2 + r'_0 + Dr'_0\sin(\theta) \quad (10)$$

The edge of the array, at (s=D2), would have a phase, ψ, relative to that at the center of $$\psi = \frac{-kD^2}{8R_0}.$$

This phase shift focuses the array at $R_o$ where $$\psi_0 = \frac{2\pi}{\lambda}(s - R_0) \text{ at } \theta = 0 \quad (11)$$

$$= 2\pi\left(\left(\frac{D}{2}\right)^2 + R_0^2\right)^{\frac{1}{2}} - R_0$$

$$= \frac{2\pi D^2}{8\lambda R_0}$$

The phase error at the edge of the antenna due to the use of the circular arc is $$\delta = k(s' - r'_0) - \psi_0 \quad (12)$$

$$= k\left(\left(\frac{r_0^2 + D^2}{4 + r_0 D\sin(\theta)}\right)^{\frac{1}{2}} - r_0\right) - \frac{\pi D^2}{4\lambda R_0}$$

Expanding for r' >> D2, $$\delta = k\left(r'_0 + \frac{D\sin(\theta)}{2} + \frac{D^2}{8r'_0} - \frac{D^2\sin^2(\theta)}{8r_0^2} - r_0\right) - \frac{\pi D^2}{4\lambda R_0} \quad (13)$$

$$= \frac{2\pi}{\lambda} \left( \frac{D\sin(\theta)}{2} + \frac{D^2\cos^2(\theta)}{8r'_0} \right) - \frac{\pi D^2}{4\lambda R_0}$$

$$r_2^2 = r_1^2 + r'_0{}^2 - 2r_1 r'_0 \cos(\theta) \tag{14}$$

$$r'_0 = r_1\cos(\theta) + (r_2^2 - r_1^2\sin^2(\theta))^{\frac{1}{2}} \tag{15}$$

$$\delta = \frac{2\pi D\sin(\theta)}{\lambda} + \frac{2\pi D^2\cos^2(\theta)}{8\lambda r'_0} - \frac{\pi D^2}{4\lambda R_0} \tag{16}$$

Where $\frac{\pi D\sin(\theta)}{\lambda}$ is just the linear term. Now $$\delta = \frac{\pi D^2}{4\lambda R_0} \left( \frac{R_0\cos^2(\theta)}{r'_0} - 1 \right) \tag{17}$$

$$\delta = \frac{\pi D^2}{4\lambda R_0} \left[ \frac{R_0\cos^2(\theta)}{r_1\cos(\theta) + (r_2^2 - r_1^2\sin^2(\theta))^{\frac{1}{2}}} - 1 \right] \tag{18}$$

If $r_1 = 0.53 R_o$ and $r_2 = 0.41 R_o$ the maximum error is $$\frac{\pi D^2(.076)}{4\lambda R_0} \tag{19}$$

With the conventional definition of far field range $$R = \frac{2D^2}{\lambda} \cdot \delta$$

can be calculated to be, $$\delta = \frac{\pi(.076)R}{8R_0} = \frac{.03R}{R_0} \tag{20}$$

$R R_o = 10$ or a maximum phase deviation of about $\lambda 20$.

If the height h, of the antenna being tested is held to the limit imposed by the far field condition for the minimum range of $r_o$, the elevation plane phase variation as $r_o$ and $\theta$ vary will have little or negligible effect on the azimuth antenna pattern. This condition is $$\frac{2h^2}{\lambda} \leq r_0(\min) = .41 R_0 \tag{21}$$

If $R_o$ set at 1/10 the far field distance given by $$R_0 = \frac{2D^2}{\lambda} (1/10) \tag{22}$$

then $$\frac{2h^2}{\lambda} \leq .41 R_0 = \frac{2D^2}{10\lambda} (.41) \tag{23}$$

or
$$h \leq .2D \tag{24}$$

This restriction of the height (that it be less than 1/5 the width of the tested antenna) can be loosened by the application of some focusing in elevation. By applying elevation plane focusing at a middle range $0.73 R_o$ in between the maximum range $R_o$ at $\theta = 0°$ and the minimum range 0.41 at $\theta = 50°$, the height restriction increases to nearly 1/3 of D. The elevation edge phase is given by, $$\psi_e = k \left\{ \left[ (.73 R_0)^2 + \left( \frac{h}{2} \right)^2 \right]^{\frac{1}{2}} - .73 R_0 \right\} \tag{25}$$

$$\approx \frac{.73\pi h^2}{2\lambda R_0} \text{ for } R_0 >> h$$

Keeping the edge phase to $\lambda 16$ or less, $$\left[ (.41 R_0)^2 + \left( \frac{h}{2} \right)^2 \right]^{\frac{1}{2}} - .41 R_0 - \frac{\psi_e}{k} << \frac{\lambda}{16} \tag{26}$$

$$\frac{h^2}{.41(2.4)R_0} - \frac{.73 h^2}{4 R_0} \leq \frac{\lambda}{16} \tag{27}$$

$$\frac{h^2}{\lambda} \leq \frac{R_0}{1.96} \tag{28}$$

If again, $$R_0 = \frac{2D^2}{\lambda} \left( \frac{1}{10} \right)$$

$$\frac{h^2}{\lambda} \leq \frac{D^2}{9.8\lambda} \tag{29}$$

or $$h \leq .32 D \tag{30}$$

In short, if no elevation plane focusing is used, the height of the antenna being tested must be 1/5 the width of that antenna. If elevation plane focusing is used, then the maximum height is just under 1/3 the width. Finally, if the elevation plane had the same focus as the azimuth plane the height would be just over 1/4 the width.

In equation (2) the ratio $G(x, \theta)$ to $R(x, \theta)$ must approximate a constant or the measured field on the focal arc will not resemble the actual far field. For example if $G(x, \theta)$ represented the pattern of an isotropic radiator $(G(x, \theta) = k)$, but $R(x, \theta)$ even for $R(x = 0)$ varies from $R_o$ to $0.41 R_o$. The far field pattern would, therefore, be too high for angles near 50°. Let the test antenna or horn be directed at the center of the rotating mount and make an angle $\alpha$ with the center of the antenna being tested. The effects of amplitude errors inherent in the measurements are now considered. Since the distance from the center of the array being tested ($r_o$) varies as a function of scan angle $\theta$, there must be a corresponding pattern variation from the test horn or the pattern of the array being tested will change incorrectly as $\theta$ varies. This is equivalent to keeping $$\frac{G(x,\theta)}{r(x,\theta)}$$

in equation (2) constant. It is relatively easy to match the $1/R_o$ variation with the choice of small feed array or horn, but the resulting variation across the array being tested is the unavoidable amplitude error. The test horn will always face the center of the mount and will make an angle $\alpha$ with the center of the array being tested. If the horn pattern is approximated by a $= b \cos(\theta)$ and by the law of sines, $\sin(\alpha) = r_2 r_1 \sin(\theta)$.

If $\frac{a + b\cos(\alpha)}{r_0'} = k$, and $k$ is 1, then $$a + b\cos(\alpha) \approx r_0' = r_1\cos(\theta) + (r_2^2 - r_1^2\sin^2(\theta))^{\frac{1}{2}} \quad (31)$$

so, $$a + b\cos(\alpha) \approx r_2\cos(\alpha) + r_1\left(1 - \frac{(r_2)^2}{r_1^2}\sin(\alpha)\right)^{\frac{1}{2}} \quad (32)$$

for small angles, $$a + b\cos(\alpha) \approx r_2\left(1 - \left(\frac{\alpha^2}{2}\right)\right) + r_1\left(1 - \frac{(r_2)^2}{r_1^2}\right) \quad (33)$$

$$\approx r_1 + r_2\left(1 - \left(\frac{\alpha^2}{2}\right)\right)\left(1 + \left(\frac{r_2}{r_1}\right)\right)$$

$$\approx r_1 + r_2\cos(\alpha)\left(1 + \frac{r_2}{r_1}\right)^{\frac{1}{2}}$$

$$a \approx r_1 = .53 \quad (34)$$

$$b \approx r_2 = .41 \quad (35)$$

$$c \approx (1 + (r_2 + r_1))^{\frac{1}{2}} = 1.33 \quad (36)$$

Since these values are derived only for small angles, minor modifications are required to cover larger ranges of $\alpha$. If $=0.56$, $b=0.38$, and $c=1.4$, then these values match $r'$ to within 2% over the 100° range. A better match is possible with a different choice of constant horn pattern representation, but this choice is clearly close enough. The choice of the correct pattern of the test probe antenna will provide a very close match to the $1/r_o$ variation to the center of the array being tested, but because of the changing distance from the edges of this array to the test probe, there will be an amplitude variation across the array aperture that will change as a function of scan angle $\theta$, beginning with, $$s' = \left(\left(\frac{D}{2}\right)^2 + (r_0')^2 + Dr_0'\sin(\theta)\right)^{\frac{1}{2}} \quad (37)$$

$$r_0' = r_1\cos(\theta) + (r_2^2 - r_1^2\sin^2(\theta))^{\frac{1}{2}} \quad (38)$$

from the law of sines, $$\Delta\alpha = \sin^{-1}\left(\frac{d\cos(\theta)}{2s'}\right) \quad (39)$$

The comparison between the test probe pattern at $\alpha + \delta\alpha$ and the s' r' variation across the aperture can now be made, and is shown in Table 2.

TABLE 2

| D/R$_o$ | α° | 0.0 | 13.0 | 26.2 | 40.3 | 56.2 | 82.0 |
|---|---|---|---|---|---|---|---|
| | θ° | 0.0 | 10.0 | 20.0 | 30.0 | 40.0 | 50.0 |
| .125 | | .948 | .909 | .832 | .718 | .562 | .313 |
| | | .934 | .892 | .814 | .699 | .544 | .288 |
| .075 | | .945 | .912 | .843 | .737 | .589 | .344 |
| | | .936 | .905 | .836 | .729 | .583 | .335 |
| 0 | | .940 | .922 | .866 | .772 | .634 | .398 |
| | | .940 | .921 | .865 | .770 | .635 | .401 |
| .075 | | .943 | .938 | .894 | .812 | .685 | .458 |

TABLE 2-continued

| D/R$_o$ | α° | 0.0 | 13.0 | 26.2 | 40.3 | 56.2 | 82.0 |
|---|---|---|---|---|---|---|---|
| | θ° | 0.0 | 10.0 | 20.0 | 30.0 | 40.0 | 50.0 |
| .125 | | .938 | .932 | .888 | .804 | .678 | .453 |
| | | .948 | .952 | .916 | .842 | .781 | .500 |
| | | .934 | .936 | .901 | .824 | .702 | .482 |

The maximum error is at $\theta=50°$ at the closest edge of the array to the test probe and in the table is given by $(0.288/0.313)^2$ or 0.7dB. This effect is equivalent at a phase error of about $\lambda 75$. For an array aperture of $0.5R_o$, this error is only equivalent to $\lambda 22$. By keeping the aperture to less than $R_o$ 3 (1dB amplitude error) along with other restrictions the total error effects should be kept to $\lambda 16$ or less. If the testing of a large physical array (but electrically small) were required the aperture requirement could be reduced to $R_o 2$ since the phase error contributions would then be negligible.

The various error conditions for the previous section can be summarized. First the error limitations due to the cubic or coma error term is, $$\frac{R_0}{\lambda} \geq .136\left(\frac{D}{\lambda}\right)^{\frac{3}{2}} \text{ for scan angles of } \pm 50° \quad (40)$$

second the error limitation due to the approximation of a circular arc instead of the actual focal arc is $$\frac{R_0}{\lambda} \geq .152\left(\frac{D}{\lambda}\right)^2 \quad (41)$$

The range limitations will be less than that caused by the cubic term for array sizes less than 80 $\lambda$. In practical terms the cubic error range limitation will dominate. Third, the amplitude error distortions across the array will be $$\frac{R_0}{\lambda} \geq \frac{2.5D}{\lambda} \quad (42)$$

Again for all arrays greater than 3 or 4 wavelengths, the range limitations is determined by the cubic error term or, $$\frac{R_0}{\lambda} \geq 2.5\frac{D}{\lambda} \text{ for } \frac{D}{\lambda} < 3.5 \quad (43)$$

$$\frac{R_0}{\lambda} \geq .136\left(\frac{D}{\lambda}\right)^{\frac{3}{2}} \text{ for } 3.5 < \frac{D}{\lambda} < 80 \quad (44)$$

$$\frac{R_0}{\lambda} \geq .152\left(\frac{D}{\lambda}\right)^2 \text{ for } \frac{D}{\lambda} > 80 \quad (45)$$

Finally, there is a height restriction n the array which is (with focusing in elevation) $h \leq 0.32D$. If a very low sidelobe range were required, for example $(6D^2\lambda)$, the equivalent edge phase error would be $\lambda 48$. With this error condition the low sidelobe conditions give the following range and height restrictions, $$\frac{R_0}{\lambda} \geq \frac{3.3h}{\lambda} \text{ for } \frac{D}{\lambda} < 2 \quad (46)$$

-continued $$\frac{R_0}{\lambda} \geq 2.36 \left(\frac{h}{\lambda}\right)^{\frac{1}{2}} \text{ for } 2 < \frac{D}{\lambda} < 27 \quad (47)$$

$$\frac{R_0}{\lambda} \geq .456 \left(\frac{h}{\lambda}\right)^2 \text{ for } \frac{D}{\lambda} > 27 \quad (48)$$

So for large low sidelobe arrays the limitation is cause by the use of the circular arc. The height restriction remains basically unchanged since smaller edge phase allowance is offset by the greater range now required.

Figure 6:
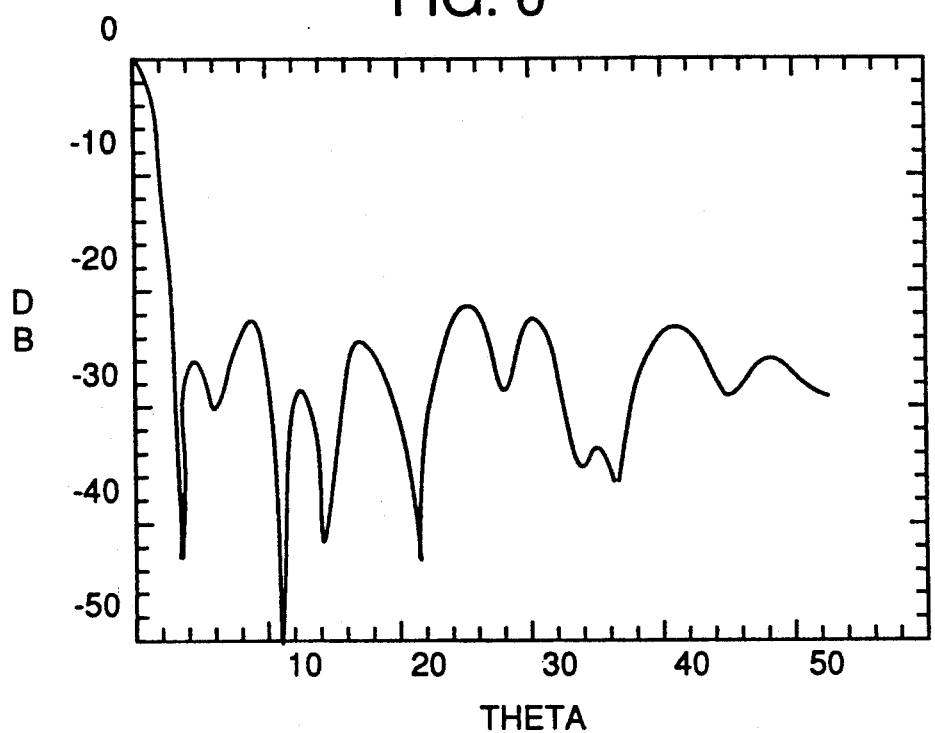
FIG. 6 is a chart of the far field pattern of a 50dB array with 64 elements.
Figure 7:
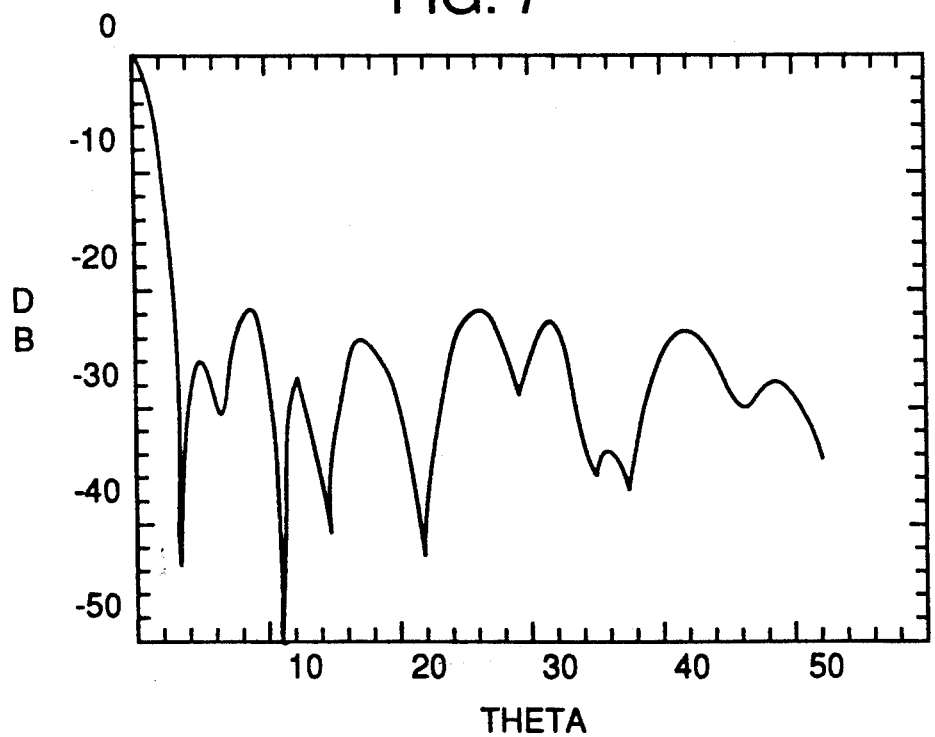
FIG. 7 is a chart of antenna pattern phenomena for the array of FIG. 6 where R equals: 19.2, 10.0 and 8.0 feet.
Figure 8:
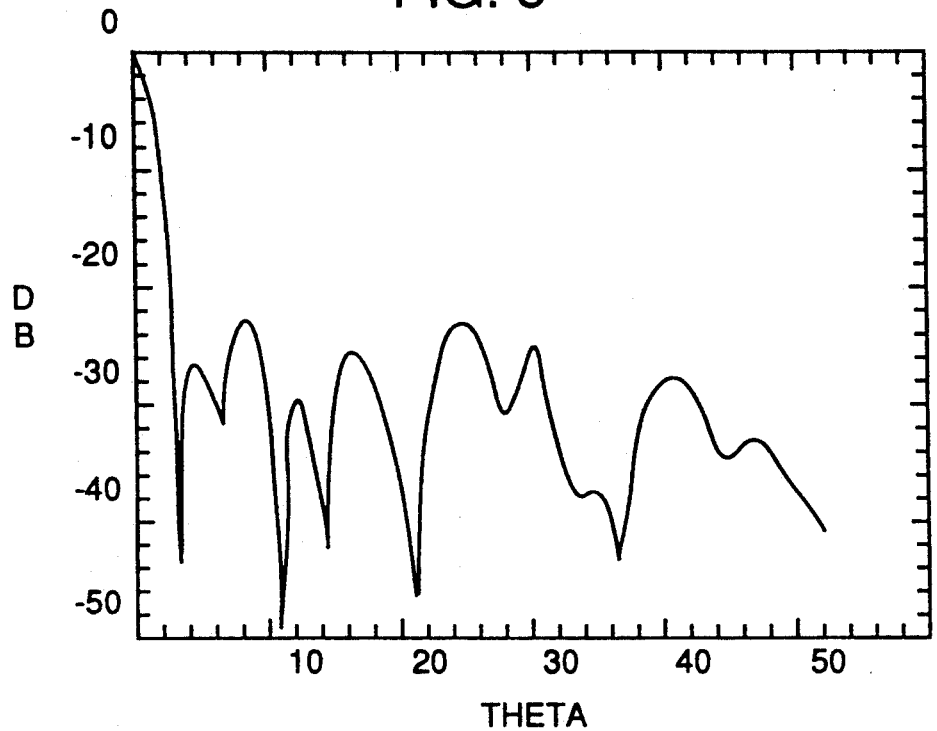
FIG. 8 is a chart of the pattern measured with the phone antenna rotated on a constant focal arc given by R cos $\theta$ where R equals 19.2, 10.0 and 8.0 feet.
Figure 9:
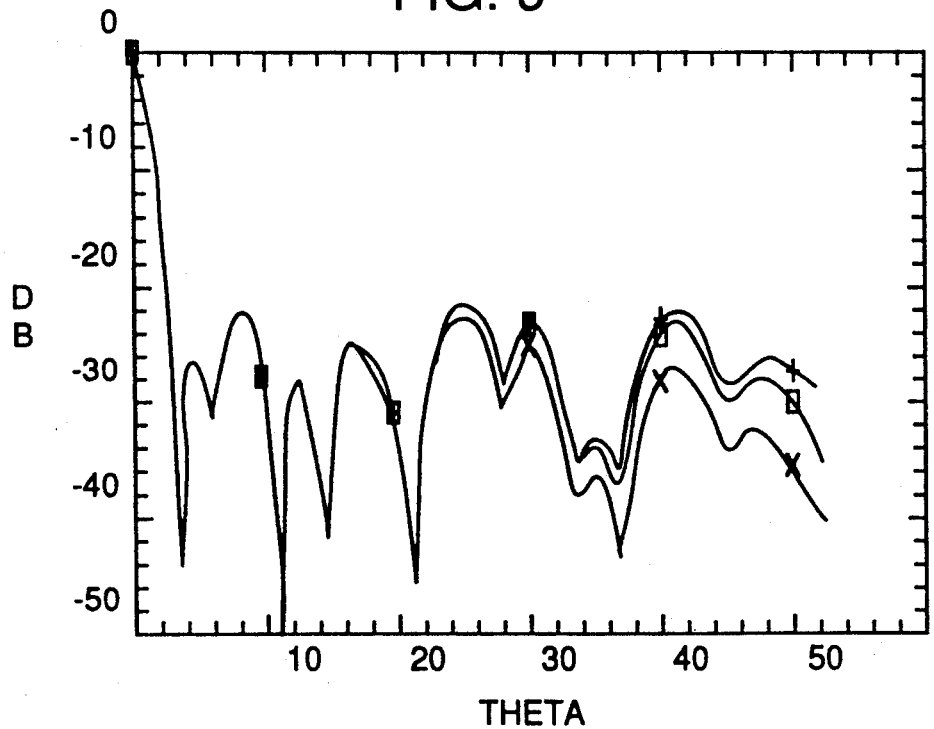
FIG. 9 is a chart of comparison plots.
Figure 10:
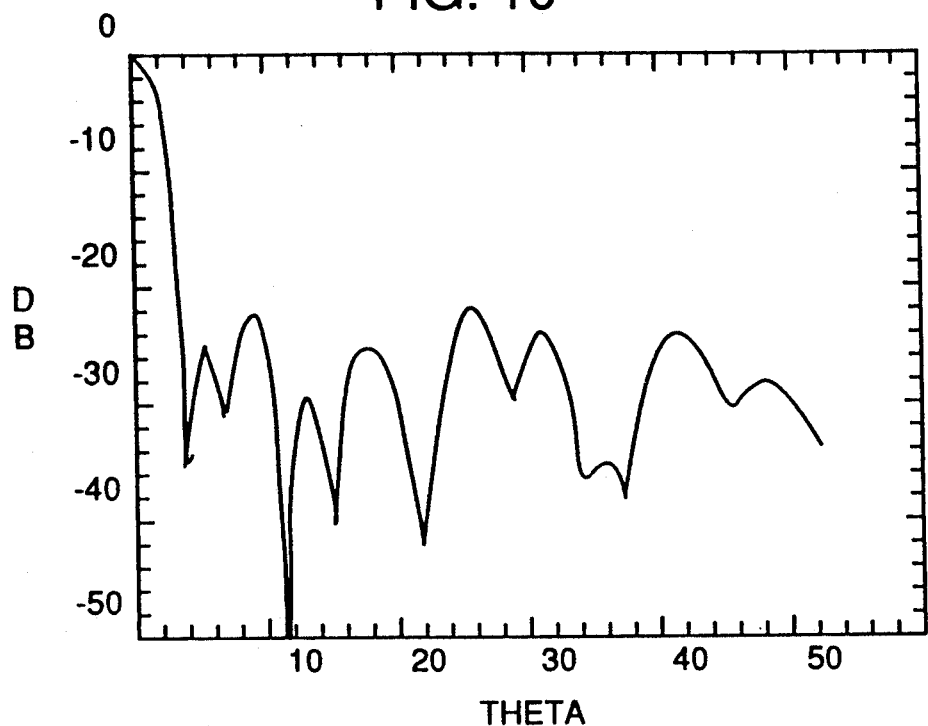
FIG. 10 is a chart of antenna patterns at R equals 9.6, 5.0 and 4.0 feet.
Figure 11:
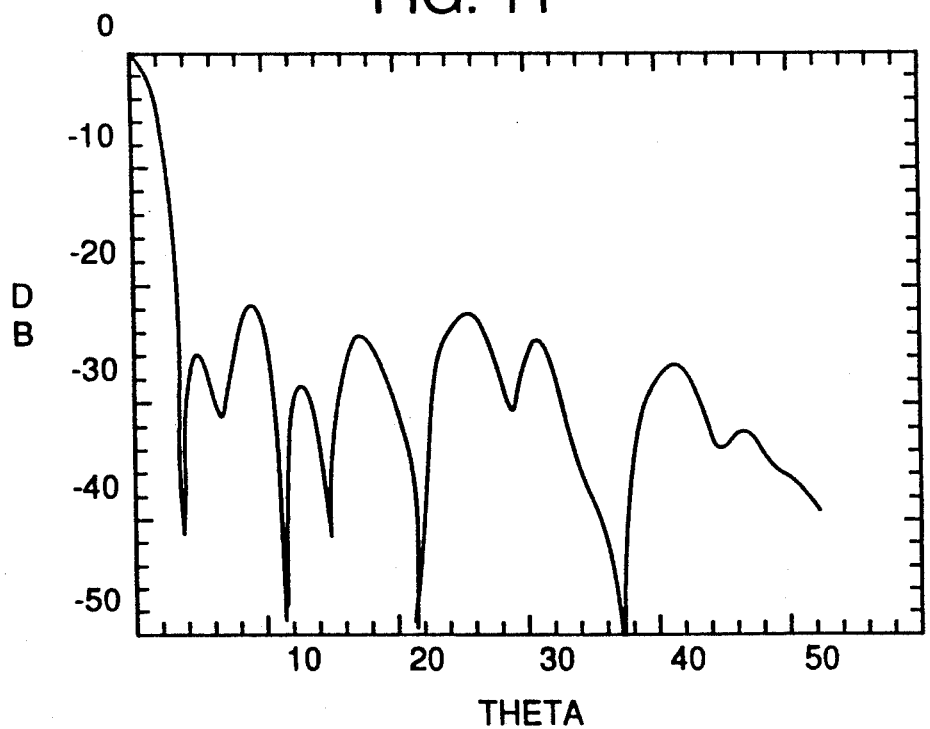
FIG. 11 is a chart of antenna patterns at R equals 9.6, 0.0, and 9.6 feet.
Figure 12:
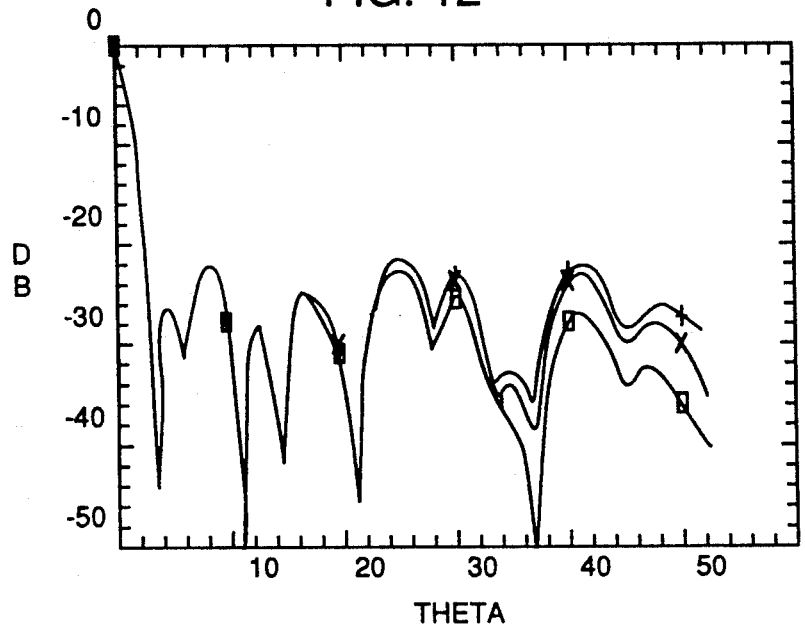
FIG. 12 is a chart of comparison plots.

The development of a computer simulation helped to determine the validity of the theoretical results. A 64 element array with λ2 spacing is used as the antenna under test (AUT). Two different cases were simulated. The first placed the test probe at 19.2ft from the AUT. The distance corresponds to 150 the actual far field distance for a 64 element array operating at X-band. FIG. 6 represents the far field of the AUT. To bring about real testing conditions a 50dB Taylor amplitude distribution with errors was applied to the array elements. This was accomplished by running a random generator with a 0.4 error margin. FIG. 7 is the pattern measured in the near field, with the probe antenna rotated on the constant focal arc given by $R_o \cos(\theta)$, with $R_o = 19.2$ft, $R_1 = 10.0$ft, and $R_2 = 8.0$ft. FIG. 8 is the pattern measured with the probe antenna rotated on a constant radial arc with $R_o = 19.2$ft, $R_o = 0$ft, and $R_o = 19.2$ft FIG. 9 shows all three results plotted together for comparison. The results show there is good agreement at all angles. Since those results show such good agreement, it was decided to reduce the far field to 1/16. FIG. 10 represents the near field pattern rotated on the focal arc with $R_o = 9.6$ft, $R_1 = 5.0$ft, and $R_2 = 4.0$ft. FIG. 11 represents the near field pattern with the probe antenna rotated on a constant radial arc with $R_o = 9.6$ft, $R_1 = 0$ft, and $R_2 = 9.6$ft. FIG. 12 represents FIGS. 6, 11, and 12 plotted together for comparison. The same simulation was run using a 30dB Taylor amplitude distribution with errors.

It is possible to reduce the distance required to measure the far field pattern of an array by close to an order of magnitude. This reduction results from swinging the probe antenna on an arc that approximates the perfect focal arc defined by $r = R_o \cos(\theta)$. A probe on this arc will give no quadratic or defocusing error. The dominant error term now becomes the cubic error term or coma. For scan ranges of ±50° the reduction in far field distance is given by this error term, and $R_o$ the short range requirement is the conventional far field range $R_{FF}$ reduced by $\frac{2}{3}(\lambda D)^{\frac{1}{2}}$ or, $$R \leq R_{FF} \frac{2}{3} \left(\frac{\lambda}{D}\right)^{\frac{1}{2}} \quad (49)$$

A 45λ array would, for example, require 1/10 the conventional far field distance. The use of this type of range imposes some restrictions. These include the array to be focused at $R_o$, the height be less than $\frac{1}{8}$ the width and the probe antenna pattern match the 1/r distance variation. With these restrictions very good results were obtained by computer simulations.

The method allows the amount of real estate needed to measure the far field performance of large antenna arrays to be reduced 1/10 the normal far field distance. It also given the ability to perform the measurements indoors.

Figure 13:
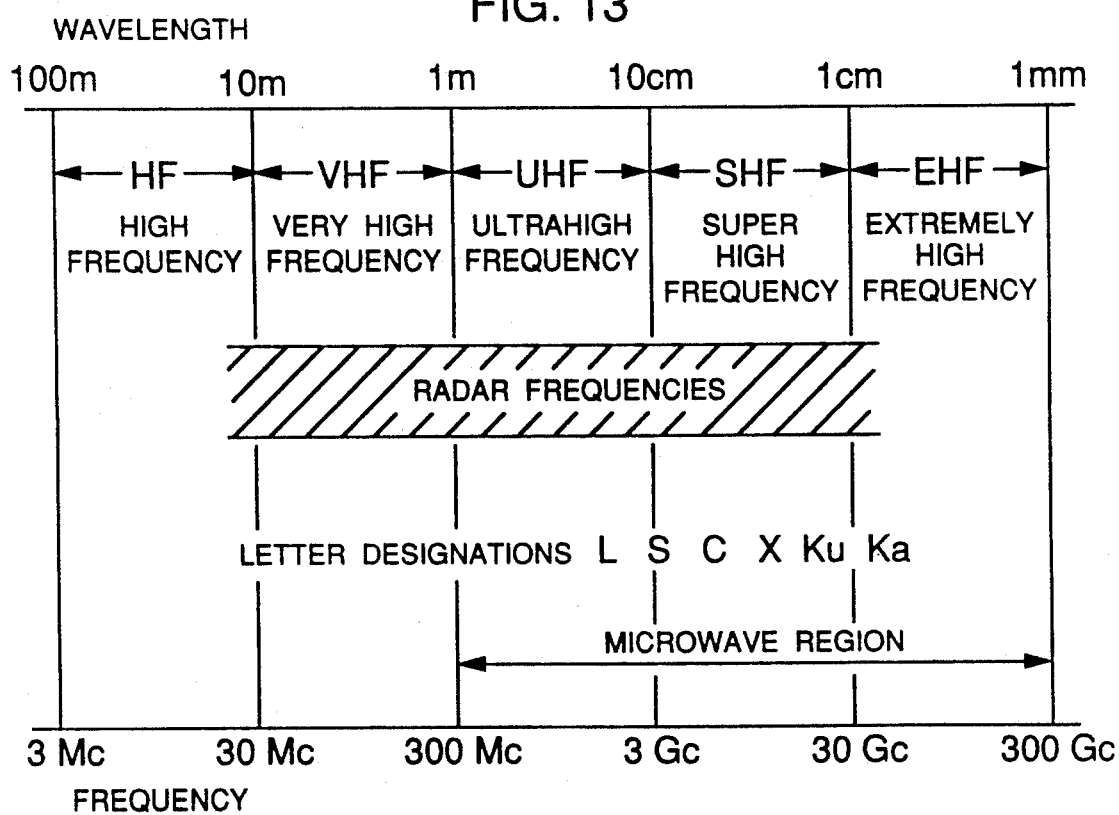
FIG. 13 is a chart that correlates the wavelength and frequencies used by most radar systems.

The usual radio frequencies used by radar systems are listed below in Table 3. The commensurate wavelength values of λ are illustrated in FIG. 13 and calculated by C=λ.f where C is the speed of light, f is the frequency and λ is the wavelength.

TABLE 3

| Radar frequency band | Frequency |
| --- | --- |
| UHF | 300–1,000 Mc |
| L | 1,000–2,000 Mc |
| S | 2,000–4,000 Mc |
| C | 4,000–8,000 Mc |
| X | 8,000–12,500 Mc |
| K | 12.5–18 Gc |
| K | 18–26.5 Gc |
| $K_a$ | 26.5–40 Gc |
| Millimeter | >40 Gc |

While the invention has been describe din its presently preferred embodiment it is understood that the words which have been used are words of description rather than words of limitation and that changes within the purview of the appended claims may be made without departing from the scope and spirit of the invention in its broader aspects.

What is claimed is:

1. A process for measuring a phased array antenna's far field antenna pattern which is exhibited as electromagnetic power measured in watts per square centimeter by a beam emitted by the phased array antenna wherein said phased array antenna has an antenna center, said process comprising the steps of:

focusing the beam onto a probe antenna which measures the beam, said probe antenna being positioned at a distance R, where R is a distance between said probe antenna and the antenna center of the phased array antenna given by $$\frac{R}{\lambda} = \left(\frac{D}{\lambda}\right)^{3/2}$$

where:
is measure of the phased array antenna's aperture and λ is a measure of operational wavelength of the beam;
measuring the electromagnetic power of the beam with the probe antenna to identify a pattern of electromagnetic power emitted there from;
moving the probe antenna to different positions that are on a focal arc of the phased array antenna; and repeating the focusing, measuring and moving steps.

2. A process, as defined in claim 1, wherein said moving step is accomplished by repositioning the probe antenna along different positions on a curve given by R cos θ where θ is an angle from broadside to the probe antenna.

3. A process, as defined in claim 1, where D/λ is up to 20 and where R/λ in said focusing step is between about 89 and 800.

4. A process, as defined in claim 1, where D/λ is up to 40 and R/λ is between about 253 and 3,200.

5. A process, as defined in claim 1, where about 60 and R/λ is between about 465 and 7,200.

6. A process, as defined in claim 2, where D/λ is up to 20 and where R/λ in said focusing step is between about 89 and 800.

7. A process, as defined in claim 2, where D/λ is up to 40 and R/λ is between about 253 and 3,200.

8. A process, as defined in claim 2, where D/λ is up to about 60 and R/λ is between about 465 and 7,200.

* * * * *